United States Patent [19]
Jeong et al.

[11] Patent Number: 5,284,782
[45] Date of Patent: Feb. 8, 1994

[54] PROCESS FOR FORMATION OF DELTA-DOPED QUANTUM WELL FIELD EFFECT TRANSISTOR

[75] Inventors: Yoon H. Jeong; Dong H. Jeong; Kyeong S. Jang, all of Pohang, Rep. of Korea

[73] Assignees: Pohang Iron & Steel Co., Ltd.; Research Institute of Industrial Science & Technology, both of Kyong Sang Book-Do, Rep. of Korea

[21] Appl. No.: 931,577

[22] Filed: Aug. 17, 1992

[30] Foreign Application Priority Data

Sep. 12, 1991 [KR] Rep. of Korea .................. 91-15938

[51] Int. Cl.$^5$ ......................................... H01L 21/265
[52] U.S. Cl. ..................................... 437/29; 437/105; 437/107; 437/126; 437/133; 437/909; 437/976
[58] Field of Search ............... 437/105, 107, 126, 976, 437/909, 29; 257/194, 657; 148/DIG. 97

[56] References Cited

U.S. PATENT DOCUMENTS

| | | | |
|---|---|---|---|
| 4,799,088 | 1/1989 | Hiyamizu et al. | 257/194 |
| 4,833,583 | 5/1989 | Ishikawa et al. | 257/194 |
| 4,882,609 | 11/1989 | Schubert et al. | 257/657 |
| 4,994,408 | 2/1991 | Johnson | 437/976 |
| 5,021,360 | 6/1991 | Melman et al. | 437/976 |
| 5,153,682 | 10/1992 | Goto et al. | 257/194 |

FOREIGN PATENT DOCUMENTS

| | | | |
|---|---|---|---|
| 276269 | 12/1986 | Japan . | |
| 3-288448 | 12/1991 | Japan | 437/107 |
| 4-112547 | 4/1992 | Japan | 437/909 |
| 4-112548 | 4/1992 | Japan | 437/909 |

OTHER PUBLICATIONS

A. Ishibashi et al., Electronics Letters, vol. 24, No. 16, Aug. 1988.
E. F. Schubert et al., IEEE, vol. 33, No. 5, May 1986.
W. P. Hong et al., IEEE, vol. 37, No. 8, Aug. 1990.
Schubert "Delta Doping III-V Compound Semiconductors: Fundamentals and Device Applications", J. Vac. Sci. & Tech. A 8(3), May/Jun., 1990, pp. 2980-2996.

*Primary Examiner*—Robert Kunemund
*Assistant Examiner*—Ramamohan Rao Paladugu
*Attorney, Agent, or Firm*—Webb, Burden, Ziesenheim & Webb

[57] ABSTRACT

A process for formation of a delta-doped quantum well field effect transistor is disclosed, and the transistor includes: a substrate, a super lattice, a buffer layer, quantum wells, a cap layer, and an ohmic layer. Then a drain, a source and a gate are formed on the ohmic layer. Each of the quantum wells is formed in such a manner that: a first GaAs layer is formed by applying a metalorganic chemical vapor deposition process under a low reaction pressure; then an Si impurity such as SiH4 or Si2H6 is delta-doped into the layer; and then, a second GaAs layer is formed by applying the metalorganic chemical vapor deposition process under the same condition, thereby forming the GaAs/AlGaAs delta-doped quantum well field effect transistor of the present invention, having the advantage of economy.

8 Claims, 5 Drawing Sheets

PROCESS FOR FORMATION OF DELTA-DOPED QUANTUM WELL FIELD EFFECT TRANSISTOR

FIELD OF THE INVENTION

The present invention relates to a process for formation of delta-doped quantum well field effect transistor which can be widely used in high speed integrated circuits and in high frequency circuits, and particularly to a process for formation of delta-doped quantum well field effect transistor which is manufactured by applying a metalorganic chemical vapor deposition process (MOCVD), thereby obtaining a GaAs/AlGaAs delta-doped quantum well field effect transistor in an economical manner.

BACKGROUND OF THE INVENTION

Conventionally, high speed GaAs/AlGaAs delta doped quantum well field effect transistors have been manufactured by applying molecular beam epitaxy process (MBE). Japanese Patent Application No. Sho-61-276269 discloses one of such GaAs/AlGaAs delta-doped quantum well field effect transistors which are formed by applying molecular beam epitaxy process. In this prior art, a delta-doped quantum well is formed on a region other than the channel, and a doped GaAs is used on the gate. With such an arrangement, not only the break-down voltage is lowered, but no other superior characteristics can be obtained in the field effect transistor.

Another example of the prior art is the GaAs field effect transistor by A. Ishibashi et al, which is described in Electronics Letters, Volume 24, No. 16, pp1034, August 1988. In this GaAs field effect transistor which provides a gate length of 0.15 $\mu$m, there is obtained a maximum intrinsic transconductance of 400 mS/mm which is a relatively high level.

A still another example of the prior art is a field effect transistor proposed by E. F. Schubert et al, which is described IEEE volume 33, No. 5, pp625, May 1986. According to this proposal, the molecular beam process is applied in such a manner that GaAs is doped in such a manner as to form an electronic concentration profile corresponding to Dirac delta function, thereby forming a field effect transistor. In this case, a high 2-dimensional electron gas (2 DEG), a high breakdown voltage and a high extrinsic transconductance can be obtained, thereby making it possible to obtain a high performance device. A still another case of the prior art is a field effect transistor by W. P. Hong et al, which is described in IEEE, volume 37, No. 8, pp1924–1926, August 1990.

The molecular beam epitaxy process is applied in forming this transistor, and a maximum transconductance of 160 mS/mm, a gate voltage swing of 2.1 V and a maximum drain current of 420 mA/mm are realized with a cap layer of 300 Å and with a gate length of 1.3 $\mu$m.

However, in the above described conventional techniques, the GaAs/AlGaAs quantum well field effect transistors are formed mostly by applying the molecular beam epitaxy process, and, if the molecular beam epitaxy process is to be carried out, an ultra high vacuum of below $10^{-11}$ torr has to be provided, with the result that the economy and productivity of the manufacturing process are aggravated.

SUMMARY OF THE INVENTION

The present invention is intended to overcome the above described disadvantages of the conventional techniques.

Therefore it is the object of the present invention to provide a process for formation of a GaAs/AlGaAs delta-doped quantum well field effect transistor for use on high speed and high frequency circuits, in which there is applied a metalorganic chemical vapor deposition process that can be easily put to the practical use, thereby obtaining more superior characteristics over that of the conventional GaAs/AlGaAs quantum well field effect transistors.

According to the present invention, the growth of the crystal of GaAs/AlGaAs is carried out at a temperature of 650°–750° C., so that the delta-doping profile should not be broadened, but a high quality crystal should be formed.

If the crystallization temperature is below 650° C., a high quality crystal can not be produced, while if it is over 750° C., the doping profile is broadened, thereby making it unsuitable for electronic devices.

Meanwhile, the thickness of the quantum well should come preferably within a range of 100–200 Å. If the thickness of the quantum well is less than 100 Å, the carrier confinement is aggravated, while if it is over 200 Å, the quantum effect is reduced.

The cap layer of the AlGaAs layer should have a thickness of 100–500 Å, with which the dispersion of the delta-doping profile can be reduced to the minimum, and a maximum transconductance can be obtained. If the thickness of the cap layer is less than 100 Å, a tunneling effect appears so as for the characteristics of the device to be deteriorated. Meanwhile, if it is over 500 Å, although the distance between the gate and channel can be adjusted through a recessing process, the source-drain resistance is increased, and the doping profile is broadened, thereby deteriorating the characteristics of the device.

During the delta doping, the Si doping range within the GaAs layer is made to be $2-7 \times 10^{12}/cm^2$ by using an n type impurity such as SiH4 or Si2H6. During the Si doping, the dopant electron concentrations are adjusted by adjusting the SiH4 or Si2H6 doping time. Further, the boundary surfaces should be abrupt and the thickness has to be adjustable.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
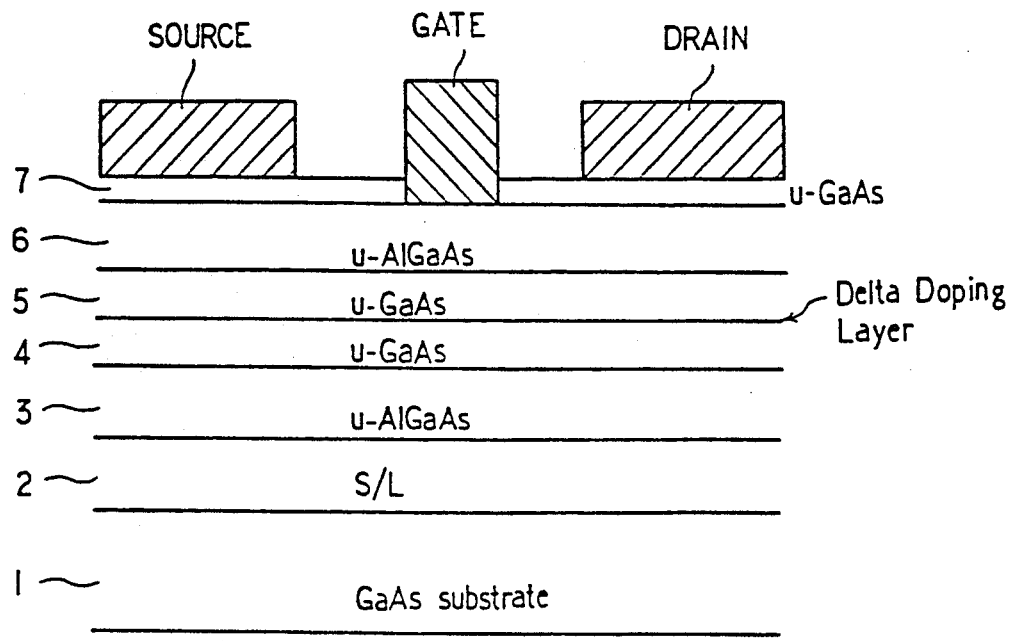
FIG. 1 is a vertical sectional view showing the constitution of the field effect transistor according to the present invention.

FIG. 1 is a vertical sectional view of the GaAs/$Al_{0.3}Ga_{0.7}As$ delta-doped quantum well field effect transistor of the present invention, which is formed by applying a metalorganic chemical vapor deposition process, and in which a delta doping is carried out into a GaAs layer provided for passing electrons.

A GaAs substrate 1 is cleaned by dipping it for 5 minutes into an ultrasonic bath using trichloro-ethylene, acetone and methanol in the cited order, i.e., by dipping it for 5 minutes respectively into these three kinds of chemicals, in order to remove organic foreign materials. Then the substrate 1 is etched by dipping it for 30 seconds into a solution composed of sulfuric acid, hydrogen peroxide and deionized water at a ratio of 4:1:1. The facility used for this process was a metalorganic chemical vapor deposition apparatus, and the flow rate was maintained at 6 standard liters per minute (SLM), while the pressure within the reaction vessel was maintained at 76 torr.

A super lattice layer (S/L) 2 is formed on the substrate 1, and this super lattice layer 2 is put into a reaction vessel into which trimethyl gallium (TMG) and trimethyl aluminum (TMA) are put in the amount of 5.8 sccm and 4.8 sccm respectively, and into which arsine gas (AsH3) is put in the amount of 0.3 SLM. Thus the layer 2 is grown so that a super lattice 50 Å of GaAs and a super lattice of 50 Å of $Al_{0.3}Ga_{0.7}As$ should be formed by 20 periods. During this process, the growth rates were 5 Å/sec for GaAs, and 6.4 Å/sec for AlGaAs.

An undoped AlGaAs buffer layer 3 is formed upon the super lattice layer 2, and, for this buffer layer 3, trimethyl gallium and trimethyl aluminum are used in the amount of 5.8 sccm and 2.5 sccm respectively. During the formation of this layer 3, the growth rate was 5.3 Å/sec for AlGaAs, and the process was continued for 31 minutes to grow 10000 Å of the AlGaAs layer.

A first GaAs quantum well 4 is formed on the buffer layer 3, and this quantum well 4 is subjected to a formation process for 15 seconds using 5.8 sccm of trimethyl gallium, thereby growing it to 75 Å. Then a valve for trimethyl gallium is locked, and instead, a valve for SiH4 or Si2H6 is opened, thereby performing a delta doping of an n type impurity into the first GaAs quantum well 4. Before and after the implementation of the process, discharges are carried out for 15 seconds and for 7 seconds respectively.

Into the first quantum well 4, an Si delta doping is carried out by applying the metalorganic chemical vapor deposition process, and then, a second quantum well 5 is grown under the same condition as that of the first quantum well 4.

An AlGaAs cap layer 6 is formed upon the second quantum well 5, by growing it for 56 seconds using 5.8 sccm and 2.5 sccm of trimethyl gallium and trimethyl aluminum respectively. The growth rate for this layer is same as that of the buffer layer 3, and therefore, the cap layer 6 is formed in a thickness of 300 Å. Thereafter, in order to reinforce an ohmic contact, a GaAs ohmic layer 7 is formed on the cap layer 6 in a thickness of 20

521. During the formation process, the amount of trimethyl gallium used is 5.8 sccm, and the growing time is 4 seconds.

Meanwhile, in the above described process, trimethyl aluminum was contained in a thermostatic oven at a temperature of 20° C., while trimethyl gallium was contained in a thermostatic oven at a temperature of $-10°$ C. Further arsine was diluted with hydrogen to 10%, and monosilane was also diluted with hydrogen to 100 ppm, while the growth temperature was 700°-750° C. Particularly, when the reactor temperature was raised and lowered, if the reactor temperature was over 400° C., 200 sccm of AsH3 was let to flow over the sample 1 in order to prevent the decomposition of the surface of the sample 1.

Table 1 below shows the amounts of the various gases, growing time and growing temperature.

<TABLE 1>

| Layers | TMG | TMA (sccm) | SiH4 | AsH3 (SLM) | Time | Growth temp (°C.) |
|---|---|---|---|---|---|---|
| GaAs/AlGaAs | 5.8 | 4.8 | | 0.3 | 8 sec | 700 or 750 |
| Super lattice | 5.8 | | | 0.3 | 10 sec | " |
| AlGaAs buffer | 5.8 | 2.5 | | 0.33 | 31 min | " |
| Quntum well 1 | 5.8 | | | 0.33 | 15 sec | " |
| Delta doping | | | 450 | 0.33 | 90 sec | " |
| Quntum well 2 | 5.8 | | | 0.33 | 15 sec | " |
| AlGaAs Cap | 5.8 | 2.5 | | 0.33 | 56 sec | " |
| GaAs ohmic layer | 5.8 | | | 0.33 | 4 sec | " |

Now the process for formation of the field effect transistor will be described.

The isolation of the device is achieved by carrying out a mesa etching and by forming an undoped layer having a low impurity concentration. The mesa etching process was carried out by using a UV contact aligner in such a manner as to form a device pattern, and by carrying out an etching by means of a composite solution of phosphoric acid, hydrogen peroxide and deionized water (mixed at a ratio of 1:1:25) for 12 seconds, thereby etching away about 700 Å.

Thereafter, a source-drain forming process is carried out in such a manner that, first the photoresist is removed, then a source-drain pattern is formed by means of a photo mask, and then, metals are deposited by applying thermal deposition process successively in the order of AuGe (1200 Å), Ni(350 Å) and Au (1500 Å). Then the metals are let to be left on the required portions by carrying out a lift-off process, and then, a heat treatment is carried out for 30 seconds at a temperature of 430° C.

Thereafter, a gate forming process is carried out to form a gate pattern of 2 μm using a gate photo mask and a contact aligner, and then, a gate recess is formed by dipping it into a solution of phosphoric acid, hydrogen peroxide and deionized water (mixed at a ratio of 3:1:50). Then a wash is carried out using deionized water, and then, a drying is carried out using nitrogen.

Then the resultant stuff is dipped into a solution of ammonium hydroxide and deionized water (mixed at a ratio of 1:15), is dried using nitrogen, and then, is put into a metallization apparatus in order to carry out a deposition of Au up to a thickness of 0.3 μm. Then a lift-off process is carried out, thereby completing the formation of the final delta-doped GaAs/Al$_{0.3}$Ga$_{0.7}$As quantum well field effect transistor of the present invention.

Figure 2:
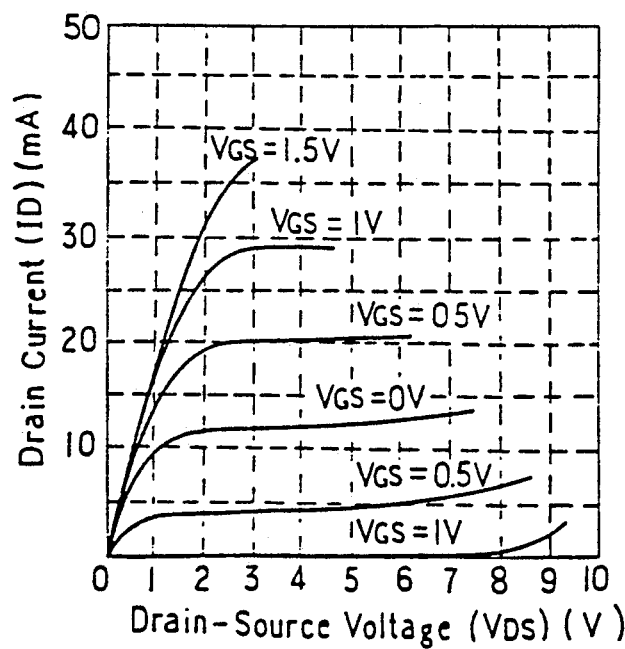
FIG. 2 is a graphical illustration showing the characteristics of the current as against the drain-source voltage for the field effect transistor according to the present invention.
Figure 3:
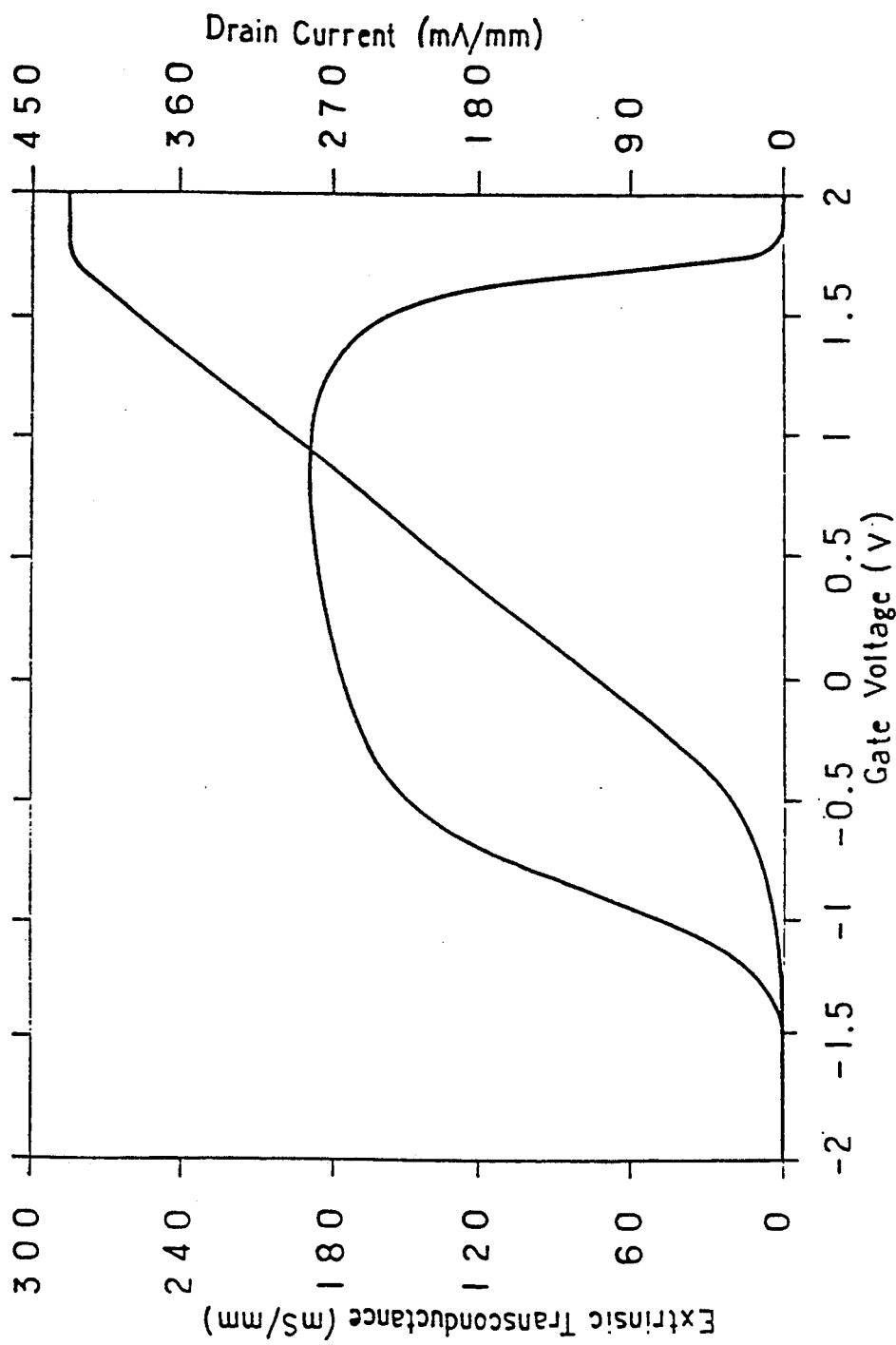
FIG. 3 is a graphical illustration showing the measured values of extrinsic transconductance and drain current as against the gate voltage for the field effect transistor of the present invention.

The current characteristics as against the drain-source voltage of the field effect transistor fabricated in the above described manner are illustrated in FIG. 2, while its drain current and transconductance characteristics as against the gate voltage are illustrated in FIG. 3.

As seen in these drawings, when the length of the gate of the field effect transistor is 2 μm, the transconductance is 190 mS/mm, and the variation range of the gate voltage is 2.5 V, while the linearity of the drain current is very satisfactory. Particularly, the maximum drain current is 425 mA/mm, and this is an improvement of several score times that of the conventional GaAs field effect transistors.

Figure 4:
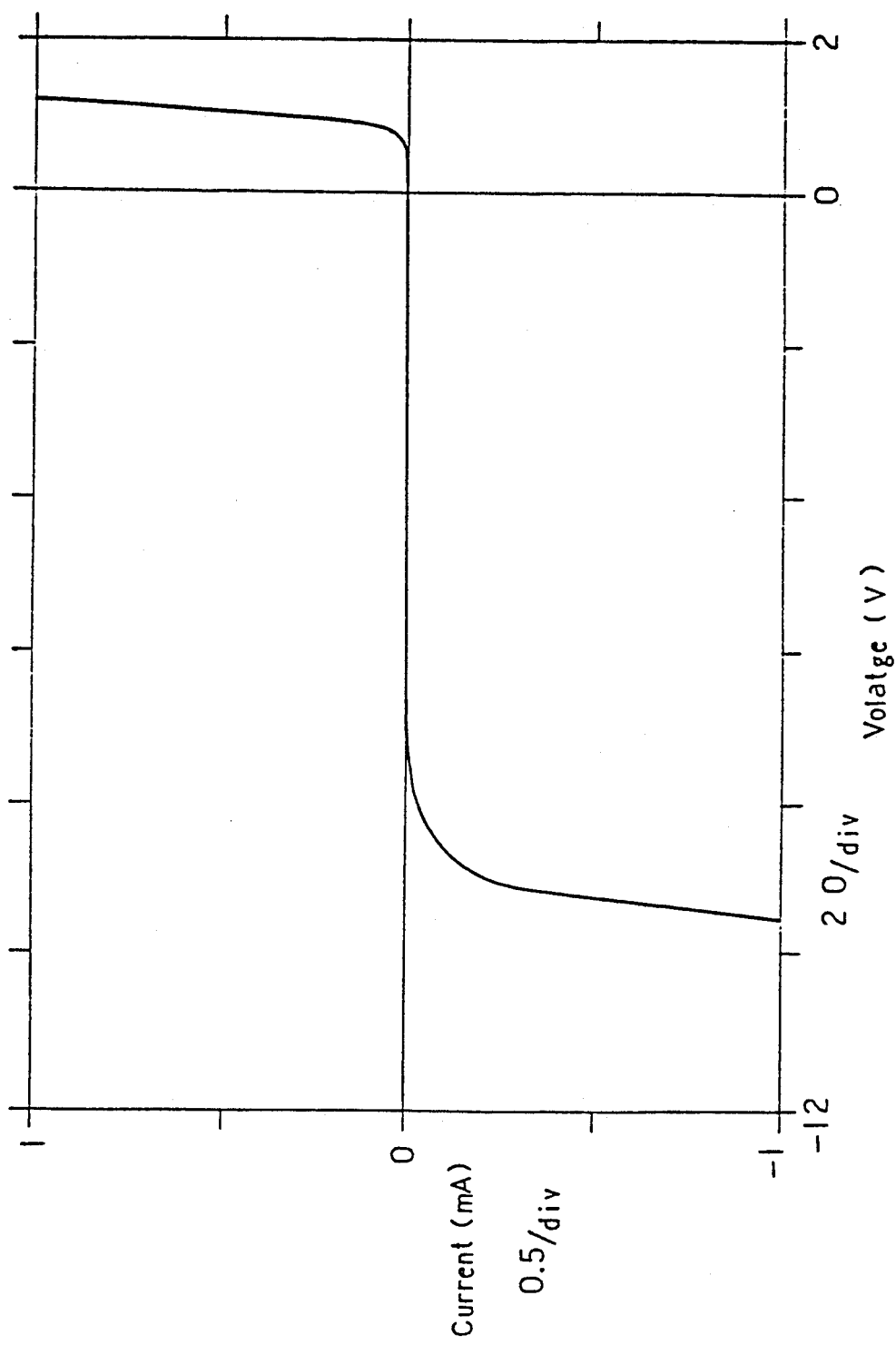
FIG. 4 is a graphical illustration showing the voltage-current characteristics of a Schottky diode manufactured according to the present invention.

FIG. 4 graphically illustrates the voltage-current characteristics of the Schottky diode having a GaAs/Al$_{0.3}$Ga$_{0.7}$As delta-doped quantum well according to the present invention.

Figure 5:
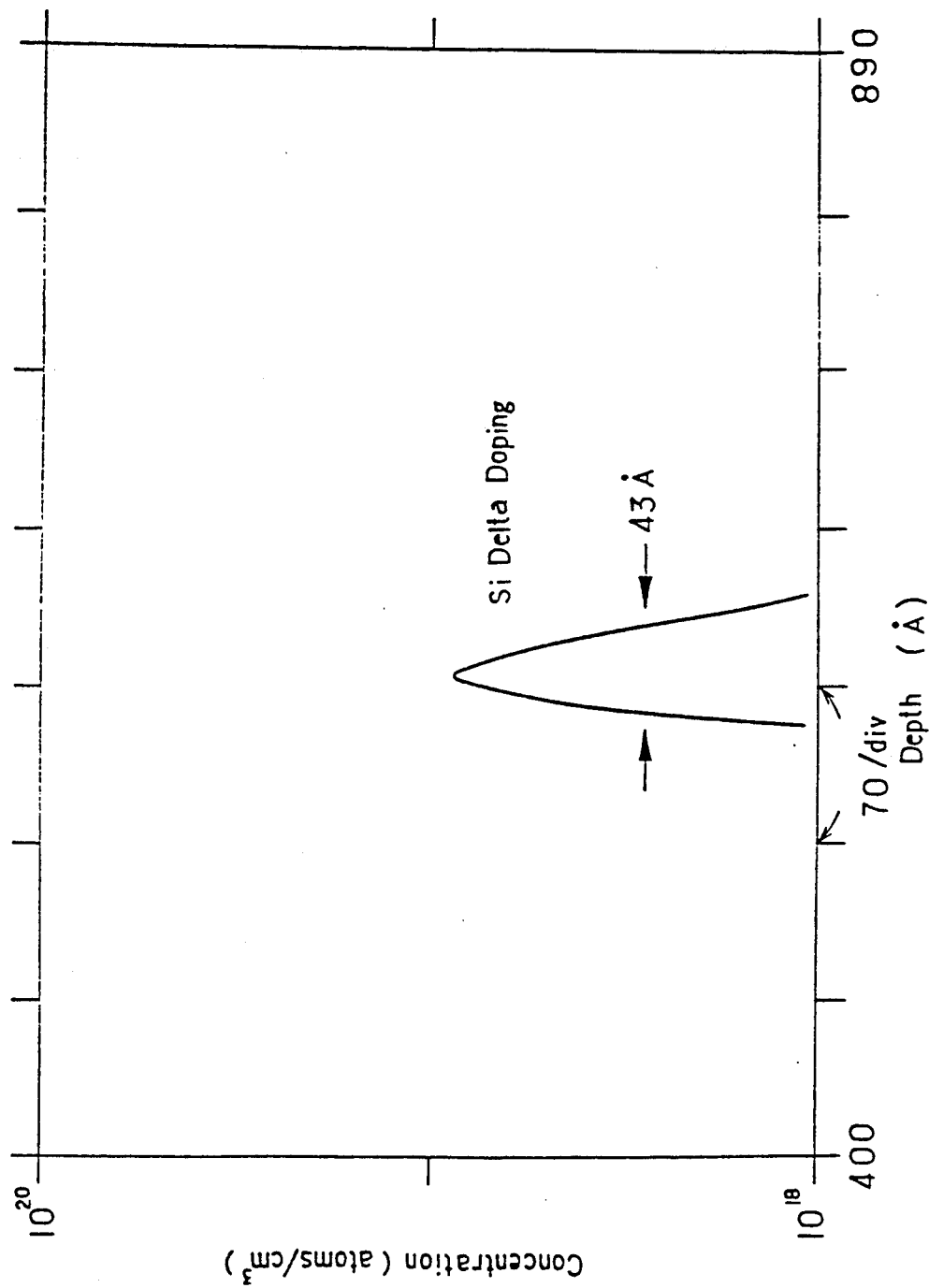
FIG. 5 illustrates a delta-doping profile of the quantum well of the field effect transistor according to the present invention.

FIG. 5 graphically illustrates the measured capacitance-voltage characteristics of the delta doping profile for the delta-doped GaAs/Al$_{0.3}$Ga$_{0.7}$As quantum well structure of the present invention. Here, the full width at a half maximum of the Si delta-doped layer is so narrow as 43 Å.

Figure 6:
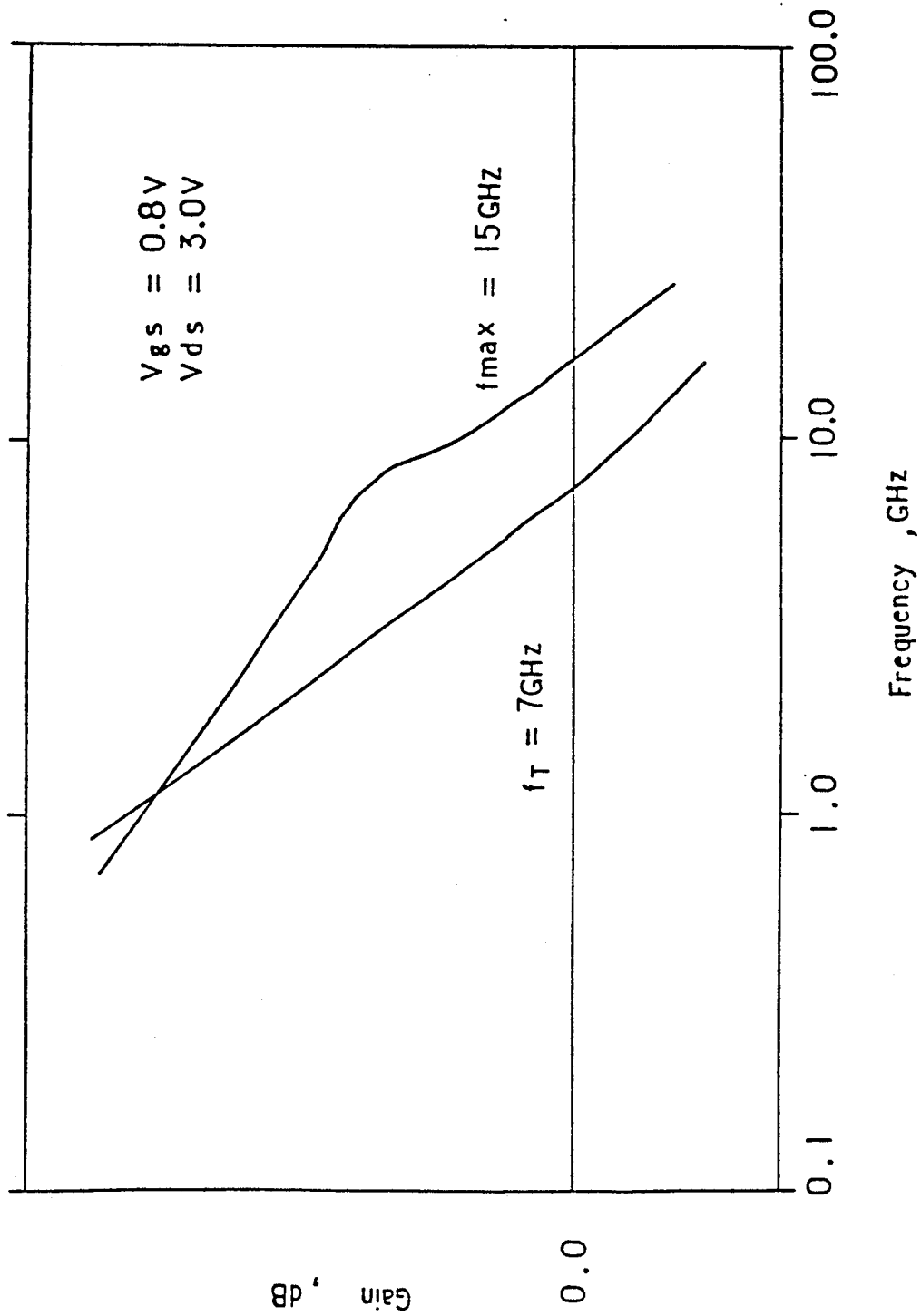
FIG. 6 illustrates current and power gains as against frequency for the field effect transistor of the present invention.

FIG. 6 graphically illustrates the current gains and power gains as against the frequency for a 2 μm × 100 μm delta-doped GaAs/Al$_{0.3}$Ga$_{0.7}$As quantum well field effect transistor according to the present invention.

According to the present invention as described above, a high speed and high performance delta-doped GaAs/AlGaAs quantum well field effect transistor can be formed within a low pressure reaction vessel by applying a metalorganic chemical vapor deposition process. Therefore, the field effect transistor of the present invention has an advantage of economy and other superior characteristics compared with the conventional delta-doped quantum well field effect transistors which can be fabricated only under an ultra high vacuum. Therefore, if the transistor of the present invention is applied to a super large computer, an ultra high speed large capacity data processing apparatus can be built.

What is claimed is:

1. A process for forming a delta-doped quantum well field effect transistor including the steps of providing a substrate, and forming a super lattice, a buffer layer, quantum wells, a cap layer and an ohmic layer, all said layers being formed in the cited order; and the steps of forming a source, a drain and a gate on said cap layer and on said ohmic layer by applying metallization and lift-off processes, the step of forming said quantum wells further comprising the steps of:

putting trimethyl gallium and arsine into a reaction vessel;

forming a first GaAs quantum well by carrying out a metalorganic chemical vapor deposition process;

doping an Si impurity into said first quantum well; and forming a second quantum well by putting trimethyl gallium and arsine into said reaction vessel and by carrying out a metalorganic chemical vapor deposition process.

2. The process for formation of a delta-doped quantum well field effect transistor as claimed in claim 1, wherein said metalorganic chemical vapor deposition process is carried out at a temperature of 650°–750° C.

3. The process for formation of a delta-doped quantum well field effect transistor as claimed in claim 1, wherein the combined thickness of said first and second quantum wells comes within a range of 100–200 Å.

4. The process for formation of a delta-doped quantum well field effect transistor as claimed in claim 1, wherein the impurity for being Si-delta-doped into said first and second quantum wells is SiH4.

5. The process for formation of a delta-doped quantum well field effect transistor as claimed in claim 1, wherein the impurity for being Si-delta-doped into said first and second quantum wells is Si2H6.

6. The process for formation of a delta-doped quantum well field effect transistor as claimed in claim 1, wherein the delta-doping range is $2-5 \times 10/cm^2$.

7. The process for formation of a delta-doped quantum well field effect transistor as claimed in claim 1, wherein, before and after carrying out the delta doping, discharges are carried out for 15 seconds and for 7 seconds respectively under a pressure of 76 torr.

8. A process for forming a delta-doped quantum wall field effect transistor comprising the steps of:

a) providing a substrate layer;

b) forming a supper lattice layer;

c) forming a buffer layer;

d) forming quantum wells in layers, wherein formation of said quantum wells includes i) putting trimethyl gallium and arsine into a reaction vessel;

ii) forming a first GaAs quantum well by carrying out a metalorganic chemical vapor deposition process;

iii) doping an Si impurity into said first quantum well; and iv) forming a second quantum well by putting trimethyl gallium and arsine into said reaction vessel and carrying out a metalorganic chemical vapor deposition process;

e) forming a cap layer;

f) forming an ohmic layer, wherein all said layers are formed in the cited order; and g) forming a gate on said cap layer through said ohmic layer and a source and drain on said ohmic layer by applying metallization and lift-off processes.

* * * * *

UNITED STATES PATENT AND TRADEMARK OFFICE
CERTIFICATE OF CORRECTION

PATENT NO. : 5,284,782
DATED : February 8, 1994
INVENTOR(S) : Yoon H. Jeong, Dong H. Jeong and Kyeong S. Jang It is certified that error appears in the above-indentified patent and that said Letters Patent is hereby corrected as shown below:

Column 1 Line 42 after "described" insert --in--.

Column 1 Line 43 after "beam" insert --epitaxy--.

Column 4 Line 1 "521 ." should read --$\overset{\circ}{A}$.--.

Column 4 Line 28, Table 1, under the heading Layers, "Quntum well 1" should read --Quantum well 1--.

Column 4 Line 31, Table 1, under the heading Layers, "Quntum well 2" should read --Quantum well 2--.

Claim 6 Line 29 Column 6 "10/cm$^2$" should read --10$^{12}$/cm$^2$--.

Signed and Sealed this

Twelfth Day of July, 1994

Attest:

BRUCE LEHMAN

Attesting Officer

Commissioner of Patents and Trademarks